United States Patent
Benisty et al.

(10) Patent No.: US 11,061,619 B1
(45) Date of Patent: Jul. 13, 2021

(54) POWER MANAGEMENT FOR DATA STORAGE DEVICES IMPLEMENTING NON-VOLATILE MEMORY (NVM) SETS

(71) Applicant: Western Digital Technologies, Inc., San Jose, CA (US)

(72) Inventors: Shay Benisty, Beer Sheva (IL); Vitali Linkovsky, Beer Sheva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/827,548

(22) Filed: Mar. 23, 2020

(51) Int. Cl.
*G06F 3/06* (2006.01)
*G06F 1/3296* (2019.01)
*G11C 16/30* (2006.01)
*G11C 16/04* (2006.01)

(52) U.S. Cl.
CPC .......... *G06F 3/0659* (2013.01); *G06F 1/3296* (2013.01); *G06F 3/0625* (2013.01); *G06F 3/0679* (2013.01); *G11C 16/30* (2013.01); *G11C 16/0483* (2013.01)

(58) Field of Classification Search
CPC .... G06F 1/3296; G06F 1/3293; G06F 3/0625; G06F 3/0659; G06F 3/0679; G11C 16/30
See application file for complete search history.

(56) References Cited

U.S. PATENT DOCUMENTS

| | | | |
|---|---|---|---|
| 7,895,466 B2 | 2/2011 | Barrow | |
| 8,331,134 B2 | 12/2012 | Chiu et al. | |
| 8,504,850 B2 | 8/2013 | Wu et al. | |
| 9,207,749 B2 | 12/2015 | Diamant et al. | |
| 2013/0132753 A1 | 5/2013 | Priel et al. | |
| 2017/0099011 A1 | 4/2017 | Freeman et al. | |
| 2018/0107417 A1 | 4/2018 | Shechter et al. | |
| 2019/0086995 A1 | 3/2019 | Koyama et al. | |
| 2021/0064119 A1* | 3/2021 | Mirichigni | G11C 11/4074 |

OTHER PUBLICATIONS

International Search Report and Written Opinion for International Application No. PCT/US2020/038776, dated Dec. 10, 2020, 8 pages.
NVM Express; "NVM Express: Base Specification;" Revision 1.4; Jun. 10, 2019; 403 pages <https://nvmexpress.org/wp-content/uploads/NVM-Express-1_4-2019.06.10-Ratified.pdf>.

* cited by examiner

*Primary Examiner* — Ernest Unelus
(74) *Attorney, Agent, or Firm* — Loza & Loza, LLP; Gabriel Fitch

(57) ABSTRACT

Methods and apparatus for managing power in data storage devices implementing non-volatile memory (NVM) sets are provided. One such apparatus includes a NVM including a first NVM set and a second NVM set, first backend logic circuitry configured to manage data storage in the first NVM set, second backend logic circuitry configured to manage data storage in the second NVM set, and power management circuitry configured to initialize the first and second backend logic circuitry to a high power state, detect an idle state for the first NVM set, store operational settings for the first backend logic circuitry, and transition the first backend logic circuitry to a low power state that consumes less power than the high power state. When a new command arrives, the first backend logic circuitry can be returned to the high power state to handle the command.

20 Claims, 11 Drawing Sheets

POWER MANAGEMENT FOR DATA STORAGE DEVICES IMPLEMENTING NON-VOLATILE MEMORY (NVM) SETS

FIELD

The disclosure relates, in some embodiments, to data storage devices. More specifically, but not exclusively, the disclosure relates to methods and apparatus for managing power in data storage devices implementing non-volatile memory (NVM) sets.

INTRODUCTION

In a variety of consumer electronics devices, data storage devices (e.g., solid state devices (SSDs)) incorporating non-volatile memories (NVMs) are replacing or supplementing conventional rotating hard disk drives for mass storage. The data storage devices are often coupled to a host using a high speed serial bus such as the Peripheral Component Internet Express (PCIe) bus. The Non-Volatile Memory Express (NVMe) specification is an industry defined interface specification for accessing non-volatile storage media (e.g., non-volatile memory) attached via the PCIe bus. A recent version of the NVMe standard, NVMe 1.4, defines a new feature called NVM sets. As defined by the standard, an NVM Set is a collection of NVM that is separate (logically and potentially physically) from NVM in other NVM Sets. One or more namespaces may be created within an NVM Set and those namespaces inherit the attributes of the NVM Set. A namespace is wholly contained within a single NVM Set and does not span more than one NVM Set. The implementation of NVM Sets to comply with the NVMe standard presents new challenges. Aspects of the present disclosure are directed, for example, to managing power in data storage devices implementing NVM Sets.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage apparatus including a non-volatile memory (NVM) including a first NVM set and a second NVM set separate from the first NVM set; a first backend logic circuitry configured to manage data storage in the first NVM set; a second backend logic circuitry configured to manage data storage in the second NVM set; and a power management circuitry configured to initialize the first backend logic circuitry and the second backend logic circuitry to a high power state; detect an idle state for the first NVM set; store, based on the detected idle state, operational settings for the first backend logic circuitry; and transition, based on the detected idle state and the operational settings, the first backend logic circuitry to a low power state that consumes less power than the high power state.

Another embodiment of the disclosure provides a method for operating a data storage apparatus including a non-volatile memory (NVM) including a first NVM set and a second NVM set separate from the first NVM set, the method including initializing a first backend logic circuitry and a second backend logic circuitry to a high power state, wherein the first backend logic circuitry is configured to manage data storage in the first NVM set and the second backend logic circuitry is configured to manage data storage in the second NVM set; detecting an idle state for the first NVM set; storing, based on the detected idle state, operational settings for the first backend logic circuitry; and transitioning, based on the detected idle state and the operational settings, the first backend logic circuitry to a low power state that consumes less power than the high power state.

Yet another embodiment of the disclosure provides a data storage apparatus including a non-volatile memory (NVM) including a first NVM set and a second NVM set separate from the first NVM set; means for managing data storage in the first NVM set; means for managing data storage in the second NVM set; means for initializing the means for managing data storage in the first NVM set to a high power state; means for initializing the means for managing data storage in the second NVM set to the high power state; means for detecting an idle state for the first NVM set; means for storing, based on the detected idle state, operational settings for the means for managing data storage in the first NVM set; and means for transitioning, based on the detected idle state and the operational settings, the means for managing data storage in the first NVM set to a low power state that consumes less power than the high power state.

Still yet another embodiment of the disclosure provides a data storage apparatus including a non-volatile memory (NVM) including a first NVM set and a second NVM set separate from the first NVM set; a first backend logic circuitry configured to manage data storage in the first NVM set; a second backend logic circuitry configured to manage data storage in the second NVM set; and power management circuitry configured to store, based on a preselected event, operational settings for the first backend logic circuitry; transition the first backend logic circuitry from a high power state to a low power state that consumes less power than the high power state; receive an indication of a new command for the first NVM set; transition, based on the indication, the first backend logic circuitry to the high power state; and restore operational settings for the first backend logic circuitry.

DETAILED DESCRIPTION

Figure 1:
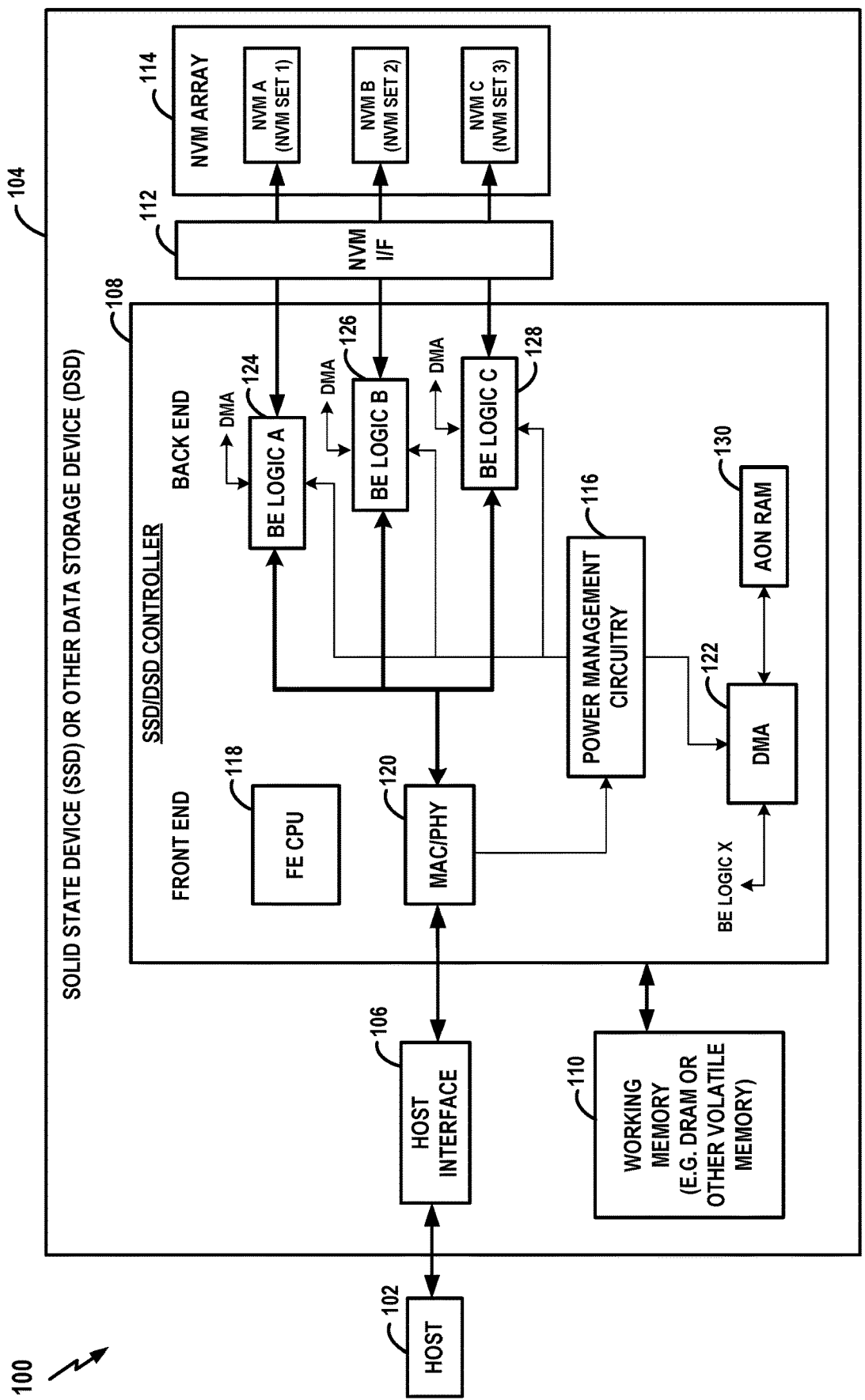
FIG. 1 is a schematic block diagram illustrating a data storage device in the form of an exemplary solid state device (SSD) including power management circuitry for controlling power to multiple backend logic circuits supporting NVM Sets in accordance with one aspect of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.
Overview As noted above, a recent version of the NVMe standard provides for a new feature called NVM Sets. An NVM Set is a collection of NVM that is separate (logically and potentially physically) from NVM in other NVM Sets. In one aspect, to support this new NVM Sets feature, data storage devices can include duplications of backend logic circuitry to support certain quality of service and/or other performance requirements. In one aspect, data storage devices can be implemented such that one NVM set does not affect the performance and quality of service of other NVM sets. In one aspect, in order to support this design goal, some resources (e.g., backend logic components such as buffers and processing engines) can be dedicated for each NVM set. However, this approach can cause higher power consumption than used in traditional SSDs, such as those that do not support NVM Sets, or newer SSDs that do support NVM Sets.

Referring now to the drawings, examples of data storage devices including power management circuitry for controlling power to multiple backend logic circuits, each dedicated to a particular NVM set, are provided. These devices can be configured to power off one or more backend logic circuits when they are not needed. These devices can also be configured to power on one or more backend logic circuits when they become needed. In one aspect, the criteria for whether to power on/off a particular backend logic circuit supporting a particular NVM set (e.g., backend logic circuit X supporting NVM set X) can be based on whether or not any commands (internal or located in a host submission queue) are pending for the NVM set X. In one aspect, additional factors may be used in the criteria, as will be discussed below. These data storage devices, and the corresponding methods of operation, provide more effective power utilization for the devices by reducing power consumption.

One such data storage device can include a non-volatile memory (NVM) including a first NVM set and a second NVM set separate from the first NVM set, a first backend logic circuitry configured to manage data storage in the first NVM set, a second backend logic circuitry configured to manage data storage in the second NVM set, and power management circuitry. The power management circuitry can be configured to initialize the first backend logic circuitry and the second backend logic circuitry to a high power state, detect an idle state for the first NVM set, store, based on the detected idle state, operational settings for the first backend logic circuitry, and transition, based on the detected idle state and the operational settings, the first backend logic circuitry to a low power state that consumes less power than the high power state.

The examples herein relate to non-volatile memory (NVM) arrays, and to data storage devices or apparatus for controlling the NVM arrays, such as a controller of a data storage device (such as an SSD), and in particular to solid-state memory storage devices such as those that use NAND flash memory (herein "NANDs"). (A NAND is a type of non-volatile storage technology that does not require power to retain data. It exploits negative-AND logic, i.e. NAND logic.) For the sake of brevity, an SSD having one or more NAND dies will be used as a non-limiting example of a data storage device (DSD) below in the description of various embodiments. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays. In addition, the various embodiments may be used in various devices which may include some combination of processing elements and memory/data storage elements, including the NVM arrays constructed/configured in accordance with the described embodiments.
Exemplary Devices, Systems and Procedures FIG. 1 is a schematic block diagram illustrating a data storage device 100 in the form of an exemplary solid state device (SSD) including power management circuitry for controlling power to multiple backend logic circuits supporting NVM Sets in accordance with one aspect of the disclosure. More specifically, the system 100 includes a host 102 and a SSD 104 (or other DSD) coupled to the host 102. The host 102 provides commands to the SSD 104 for transferring data between the host 102 and the SSD 104. For example, the host 102 may provide a write command to the SSD 104 for writing data to the SSD 104 or a read command to the SSD 104 for reading data from the SSD 104.

The host 102 may include one or more submission queues (not shown) that store pending read and write commands for the SSD 104 to retrieve and execute. When the host 102 makes a change to a submission queue, the SSD 104 can receive and/or retrieve a doorbell notification to signify the change (e.g., that a new read or write command has been placed in the queue). The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples.

The SSD 104 includes a host interface 106, an SSD or DSD controller 108, a working memory 110 (such as DRAM or other volatile memory), an NVM interface 112, and an NVM array 114 including three distinct NVMs. The three NVMs include NVM A, NVM B, and NVM C, each of which may include one or more NVM dies. NVM Set 1 is the collection of NVM that includes only the one or more dies of NVM A. Similarly, NVM Set 2 is the collection of NVM that includes only the one or more dies of NVM B, and NVM Set 3 is the collection of NVM that includes only the one or more dies of NVM C.

The host interface 106 is coupled to the controller 108 and facilitates communication between the host 102 and the controller 108. The controller 108 is coupled to the volatile memory 110 as well as to the NVM array 114 via the NVM interface 112. The host interface 106 may be any suitable communication interface, such as a NVMe interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. Given that the NVM Sets are a feature of NVMe 1.4, the NVMe interface can be a preferred implementation of the host interface. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link. In one aspect, each NVM set has a corresponding submission queue in the host (e.g., such that they are paired with a one to one correspondence).

Although, in the example illustrated in FIG. 1, SSD 104 includes three channels between controller 108 and NVM array 114 via NVM interface 112, the subject matter described herein is not limited to having three memory channels. For example, in some NAND memory system architectures, two, four, eight or more NAND channels couple the controller and the NAND memory device, depending on controller capabilities. In any of the embodiments described herein, more than, or less than, three channels may be used between the controller and the NVMs, even if three channels are shown in the drawings. The controller 108 may be implemented in a single integrated circuit chip and may communicate with different layers of memory in the NVM 114 over one or more command channels.

The controller 108 controls operation of the SSD 104. In various aspects, the controller 108 receives commands from the host 102 through the host interface 106 and performs the commands to transfer data between the host 102 and the NVM array 114. Furthermore, the controller 108 may manage reading from and writing to volatile memory 110 for performing the various functions effected by the controller and to maintain and manage cached information stored in the volatile memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, application specific integrated circuit (ASIC), or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The working memory 110 may be any suitable memory, computing device, or system capable of storing data. For example, working volatile memory 110 may be ordinary RAM, DRAM, double data rate (DDR) RAM, static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the working memory 110, or a portion thereof, to store data during the transfer of data between the host 102 and the NVM array 114. For example, the working memory 110 or a portion of the volatile memory 110 may be a cache memory. In some embodiments, working memory 110 may be replaced by a non-volatile memory such as MRAM, PCM, ReRAM, etc. to serve as a working memory for the overall device.

The NVM array 114 receives data from the controller 108 via the NVM interface 112 and stores the data. The NVM array 114 may be any suitable type of non-volatile memory, such as NAND-type flash memory array dies or the like. The NVM array 114, including each of NVM A, NVM B, and NVM C, may include multiple dies. In some embodiments, the NVM array 114 may include non-volatile memory such as MRAM, PCM, and/or ReRAM. In the example of FIG. 1, the NVM array 114 includes three distinct NVMs, each supporting one NVM set. In other embodiments, the NVM array 114 can include more than or less than three NVM and corresponding NVM sets.

In the example of FIG. 1, the SSD controller 108 also includes front end circuitry, backend circuitry, and power management circuitry 116. The front end circuitry includes a front end processor or central processing unit (CPU), "FE CPU", 118, medium access control/physical layer circuitry (MAC/PHY circuitry) 120, and DMA circuitry 122. The backend circuitry includes distinct sets of backend logic circuitry, including BE LOGIC A 124, BE LOGIC B 126, BE LOGIC C 128, each coupled to a single group of NVM (i.e., NVM Set 1, NVM Set 2, or NVM Set 3, respectively) in the NVM array 114. In a main control path, the MAC/PHY circuitry 120 is coupled to the host interface 106 and each of BE LOGIC A 124, BE LOGIC B 126, BE LOGIC C 128, and the power management circuitry 116. The power management circuitry 116 is coupled to each of BE LOGIC A 124, BE LOGIC B 126, BE LOGIC C 128, and the DMA circuitry 122. The DMA circuitry 122 is coupled to each of BE LOGIC A 124, BE LOGIC B 126, BE LOGIC C 128, and an always on RAM (AON RAM) circuitry 130, which may be a fast persistent memory.

In operation, the MAC/PHY circuitry 120, together with the DMA circuitry 122 and/or FE CPU 118, is configured to facilitate data transfer between the host 102, via the host interface 106, and the NVM Sets of NVM array 114, via respective backend logic circuitry (124, 126, 128). The MAC/PHY circuitry 120 can receive host commands and work with the DMA circuitry 122 execute the transfers of data, often between the host interface 106 and the NVM array 114, while sometime using the working memory 110 as a buffer.

In operation, the power management circuitry 116 can initialize each of the backend logic circuitry (124, 126, 128) to a high power state (e.g., a powered on state). If the power management circuitry 116 detects that one of the NVM sets is not being used, it can transition (e.g., power off) the corresponding backend logic circuitry to a low power state (e.g., a powered off state or some other state lower in power than the high power state) after storing some operational settings. If the power management circuitry 116 later detects that the powered off NVM set is needed, it can power on the corresponding backend logic circuitry and restore the operational settings. Additional details about the SSD 108 and power management circuitry 116 operation are described below. In one aspect, the power management circuitry 116 can power off two or more of the backend logic circuits if the corresponding NVM sets are not being used.

The power management circuitry 116 may include a microprocessor, a microcontroller, an embedded controller, a logic circuit, software, firmware, application specific integrated circuit (ASIC), or any kind of processing device, for performing one or more of the functions described herein as being performed by the power management circuitry 116. In one aspect, the power management circuitry 116 may work with and/or include the FE CPU 118 and/or include one or more processors contained in the backend logic circuitry (124, 126, 128). In one aspect, the FE CPU 118 and/or one or more processors contained in the backend logic circuitry may replace and perform the functions of the power management circuitry 116.

As used herein, the term "NVM set" refers to a collection of NVM that is separate (logically and potentially physically) from NVM in other NVM Sets, as defined in the NVMe standard.

As used herein, the term "namespace" refers to a portion of an NVM wholly contained within a single NVM Set and shall not span more than one NVM Set, where one or more namespaces may be created within an NVM Set and those namespaces inherit the attributes of the NVM Set. This term is the same as is defined in the NVMe standard.

Figure 2:
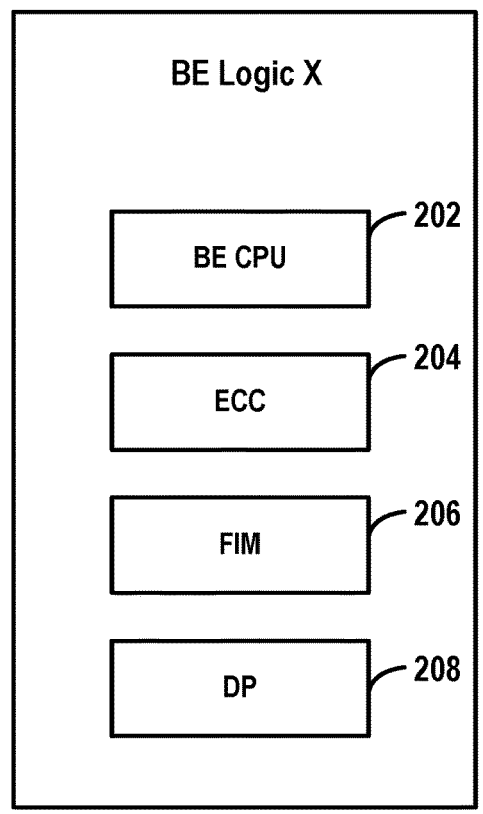
FIG. 2 is a schematic block diagram illustrating exemplary backend logic circuitry for supporting an NVM Set in accordance with one aspect of the disclosure.

As used herein, the term "backend logic circuitry" or "backend logic circuit" refers to one or more circuits contained within a data storage device and configured to, and dedicated to, manage storage in a single NVM set. Examples are shown in FIGS. 1, 2, 7, 10, 11. Examples of component circuits are shown in FIG. 2.

As used herein, the term "front end logic circuitry" or "front end logic circuit" refers to one or more circuits contained within a data storage device and configured to execute commands from a host. Examples are shown in FIG. 1, and can include a front end processor or central processing unit (CPU), "FE CPU", 118, medium access control/physical layer circuitry (MAC/PHY circuitry) 120, and DMA circuitry 122.

As used herein, the term "power management circuitry" or "power management circuit" refers to one or more circuits contained within a data storage device and configured to manage or control power to one or more of the backend logic circuits. Examples are shown in FIGS. 1, 7, 10, 11.

As used herein, the term "high power state" refers to a powered on state for one or more circuits.

As used herein, the term "low power state" refers to a lower power state than the high power state, including for example, a state where no power is provided.

In the SSD controller 108 of FIG. 1, three backend logic circuits are included, with corresponding NVM sets. In other embodiments, the SSD controller 108 may include more than or less than three backend logic circuits and the corresponding NVM sets.

FIG. 2 is a schematic block diagram illustrating exemplary backend logic circuitry 200 for supporting an NVM Set in accordance with one aspect of the disclosure. In one aspect backend logic circuitry 200 can be used in any of the backend logic circuits (124, 126, 128) of FIG. 1 or other backend logic circuits described herein. The backend logic circuitry 200 includes a backend CPU 202, an error correction circuitry (ECC) 204, a flash interface module (FIM) circuitry 206, and a data path (DP) circuitry 208. Each of these components may be coupled to one another and configured to work collaboratively to achieve the functions of the overall backend logic circuitry. In one aspect, backend logic circuitry 200 may contain additional components/circuitry or disclude one or more of the depicted components.

The backend CPU 202 may include a microprocessor, a microcontroller, an embedded controller, a logic circuit, software, firmware, application specific integrated circuit (ASIC), or any kind of processing device, for performing one or more of the functions described herein as being performed by the backend CPU 202. In operation, backend CPU 202 can receive commands and work to execute the commands by storing or retrieving data in the NVM array (e.g., NVM array 114), and more specifically, one of the distinct NVM components that form the NVM array. As shown in FIG. 1, these NVM components include NVM A for NVM Set 1, NVM B for NVM Set 2, and NVM C for NVM Set 3. The backend CPU 202 can also work with the other BE logic circuitry components to execute the various commands. The ECC 204 is responsible for correcting errors in data stored or retrieved in the NVM array. The FIM 206 is responsible for controlling and accessing the memory arrays with the NVM array, possibly in conjunction with the backend CPU 202. The DP circuitry 208 is responsible for the physical transport of data to and from the NVM array, possibly via an NVM interface (e.g., NVM interface 112).

In one aspect, the backend logic circuitry 200 can include additional components. For example, the backend logic circuitry 200 can also include RAID logic circuitry for providing functionality consistent with Redundant Array of Inexpensive Disks (RAID) technology. This may include exclusive OR (XOR) circuitry as well for extra error correction capability. In one aspect, the backend logic circuitry 200 can include security logic circuitry configured to provide encryption and decryption. In one aspect, the backend logic circuitry 200 can further include a scheduler that is responsible for scheduling the commands to the NVM (e.g., NAND, and based on NAND timing and power allocation). In any case, each of these additional components can be powered on and powered down (or placed in a low power state) in accordance with the embodiments described herein.

Figure 3:
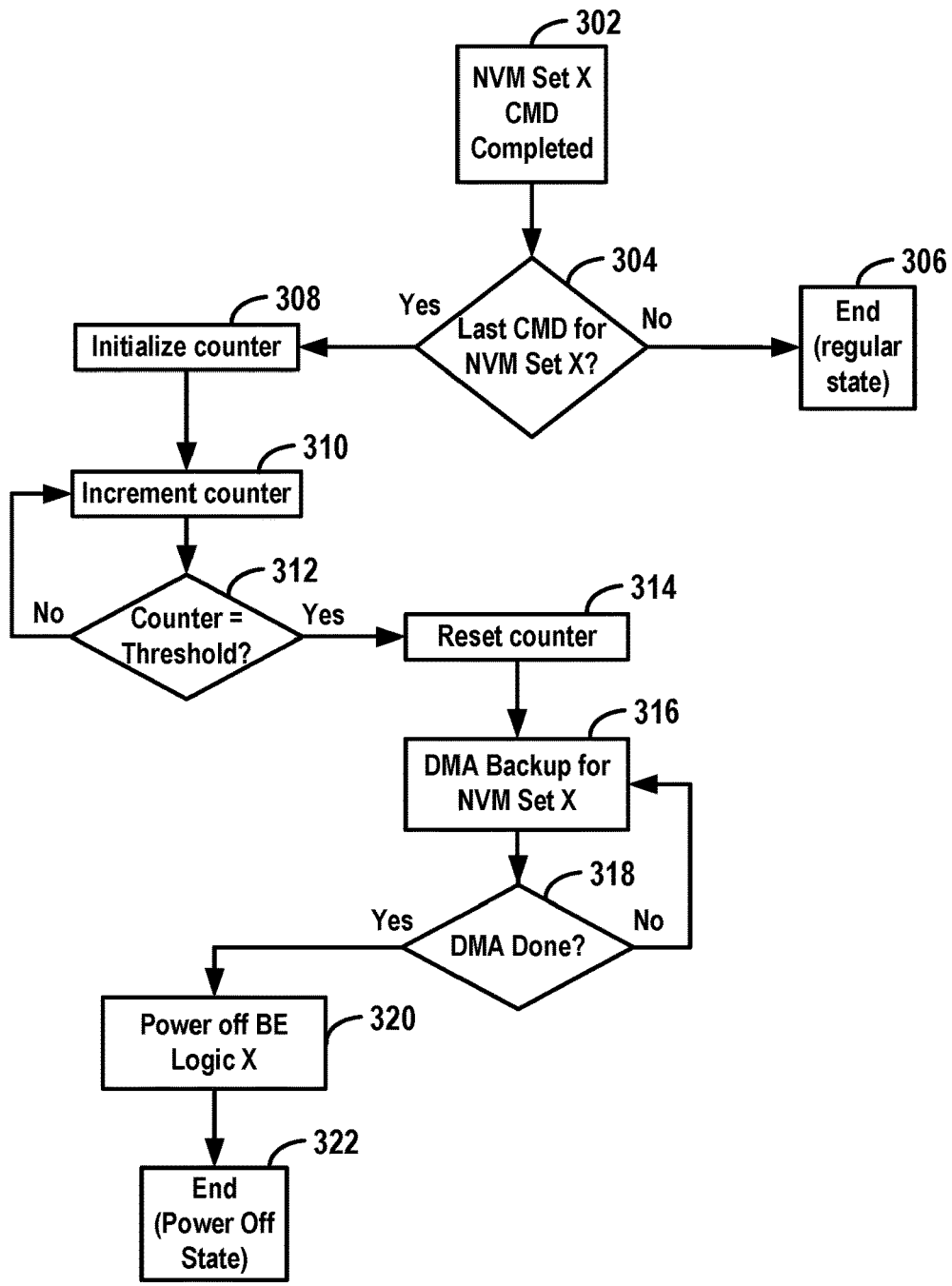
FIG. 3 is a flowchart illustrating an exemplary method that may be performed by the power management circuitry of FIG. 1 to power off a backend logic circuit in accordance with one aspect of the disclosure.

FIG. 3 is a flowchart illustrating an exemplary method 300 that may be performed by the power management circuitry of FIG. 1 to power off a backend logic circuit in accordance with one aspect of the disclosure. In one aspect, method/process 300 may be performed by the power management circuitry 116 in the SSD 104 of FIG. 1, or other power management circuitry described herein. While not shown, the method 300 or a prior process may initialize each of the backend logic circuits (e.g., 124, 126, 128 in FIG. 1) to a high power state (e.g., powered on state). In one aspect, this may occur when the SSD is first powered on.

In block 302, the process determines that a command was completed for a given NVM set, NVM Set X. In block 304, the process then determines whether the completed command was the last command for the NVM Set X. This may be achieved by determining that no commands are pending at the host for NVM Set X (e.g., by determining that a particular submission queue dedicated to NVM Set X is empty) and that no internal commands (e.g., internal to the SSD) are pending for NVM Set X. If the completed command was not the last, the process proceeds to block 306 where it effectively ends (e.g., ends and continues the normal SSD operation or regular state). If the completed command was the last, the process proceeds to block 308 where it initializes a counter. This counter can provide a short waiting period to ensure that another command for the NVM Set X is not about to arrive.

In block 310, the process increments the counter. In block 312, the process determines whether the counter has reached a threshold. If it has not, the process returns to block 310 to increment the counter. On the other hand, if the counter has reached the threshold, the process proceeds to block 314 where it resets the counter.

In block 316, after the counter was reset, the process executes a DMA backup for NVM Set X. In such case, the process, using the DMA circuitry (e.g., such as DMA 122 in FIG. 1), can store operational settings for NVM Set X and/or operational settings for BE logic circuitry X, which is coupled to and supports NVM Set X (e.g., BE logic A and NVM Set 1 in FIG. 1). In one aspect, the DMA circuitry stores the operational data/settings in an always on RAM, such as the AON RAM 130 of FIG. 1. In one aspect, the backup operations of the DMA circuitry can instead be performed by a processor such as the front end CPU 118 of FIG. 1. In one aspect, the operational settings can include (1) component/block (e.g., ECC, FIM, DP) configurations and operation mode, (2) current state of the blocks (e.g., the values of internal pointers to be recovered when waking up, and/or (3) internal tables stored in RAMs.

In block 318, the process determines whether or not the DMA circuitry is done. If it is not, the process returns to block 316. If the DMA is done, the process proceeds to block 320 where it powers off the BE Logic X circuitry. In one aspect, the process does not entirely power off the BE Logic X circuitry and instead transitions the BE Logic X circuitry to a low power mode. In block 322, after the block 320, the process ends (e.g., ends and the BE Logic X enters the power off state).

In one aspect, using the timer in blocks 308-214 helps to avoid a scenario where the process puts the BE logic X circuitry in a low power state and immediately after the host sends a command directed to the NVM Set X. In that case, instead of saving power, the process may end up wasting power since the power transitions consume power. This scenario may occur in low-queue depth of the submission queue (e.g., queue depth one). For example, the host sends only one command for NVM Set X, and the next command will be sent only after completing the first command. In one aspect, a typical value for this timer could be 1 millisecond (ms). However, in one aspect, the value of the timer may depend on history. For example, if the host usually does not send any other commands following the "Idle" state, the value of the timer could be 0.

In one aspect, during any of blocks 308-318, if a new command is received for NVM Set X, then the process may proceed to block 306 and end.

In one aspect, the process can perform the sequence of actions in a different order. In another aspect, the process can skip one or more of the actions. In other aspects, one or more of the actions are performed simultaneously. In some aspects, additional actions can be performed. In one aspect, any of the actions of FIG. 3 can be used in conjunction with any of the examples described above.

Figure 4:
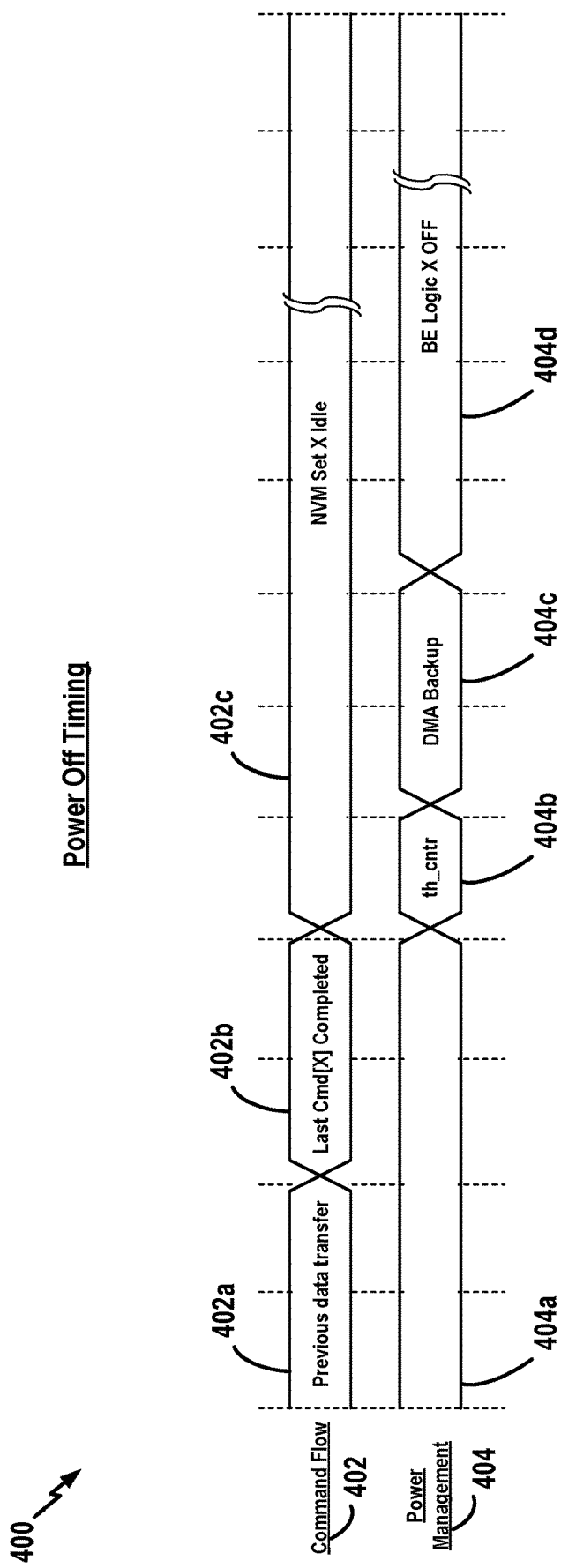
FIG. 4 is a timing diagram illustrating command activities and power management activities to power off a backend logic circuit in accordance with one aspect of the disclosure.

FIG. 4 is a timing diagram 400 illustrating command activities 402 and power management activities 404 to power off a backend logic circuit in accordance with one aspect of the disclosure. In one aspect, timing diagram 400 can provide a visual indicator of the command and power management activities of the power off process of FIG. 3. The command flow can begin with some previous data transfer 402a, while the power management begins with no activity 404a. After the previous data transfer 402a, the command flow proceeds to a last command completed for a given NVM set (e.g., Last CMD[X] Completed) 402b. The power management, upon detecting the last command completed, and/or the idle state for NVM Set X, starts a threshold counter (th_cntr) 404b. For the command flow, the NVM Set X is idle 402C while the threshold counter runs. After the threshold counter 404b reaches a pre-selected threshold, the power management performs the DMA backup 404c (e.g., by sending a request to DMA circuitry). After the DMA backup 404c, the power management powers off the BE Logic X 404d. A number of these activities and the timing correspond to actions of the process of FIG. 3.

Figure 5:
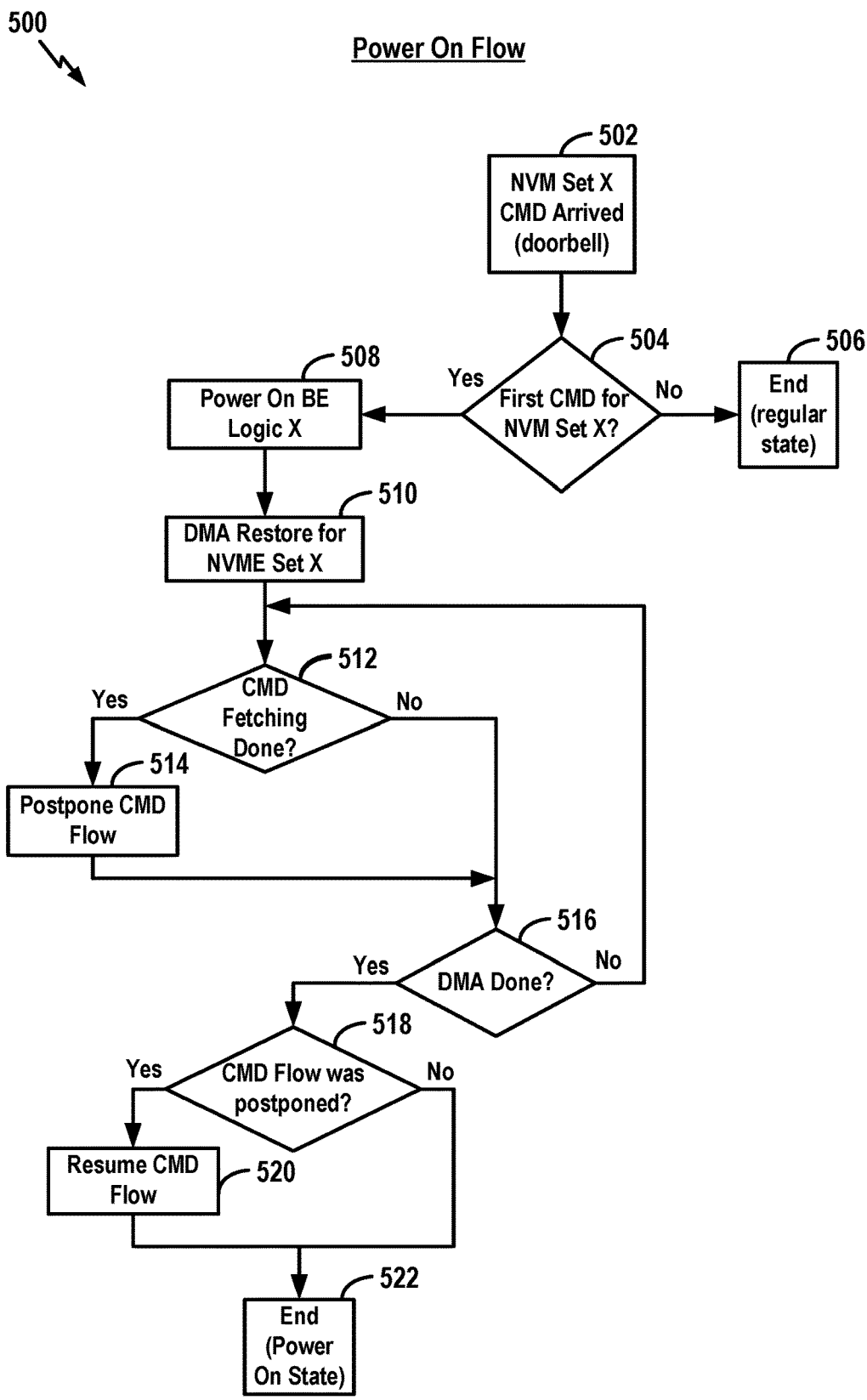
FIG. 5 is a flowchart illustrating an exemplary method that may be performed by the power management circuitry of FIG. 1 to power on a backend logic circuit in accordance with one aspect of the disclosure.

FIG. 5 is a flowchart illustrating an exemplary method 500 that may be performed by the power management circuitry of FIG. 1 to power on a backend logic circuit in accordance with one aspect of the disclosure. In one aspect, method/process 500 may be performed by the power management circuitry 116 in the SSD 104 of FIG. 1, or other power management circuitry described herein. While not shown, the method 500 or a prior process has powered off one the backend logic circuits (e.g., BE Logic X such as 124, 126, 128 in FIG. 1) that corresponds to NVM Set X (e.g., which may be in an idle state). In one aspect, this may have occurred during the process 300 of FIG. 3.

In block 502, the process determines, via a doorbell notification received and/or retrieved from a host, that a new command has been issued by the host for NVM Set X. In one aspect, the doorbell notification may be a notification from the host that the host just made a change to a submission queue. In one aspect, the changed submission queue can be dedicated to NVM Set X.

In block 504, the process determines whether the new command is the first command for the NVM Set X, received in a preselected time period. In one aspect, the process may determine that the new command is the first command received for the NVM Set X after an idle period for the NVM Set X. In one aspect, the process may determine that the new command is not the first command received for the NVM Set X over the preselected time period. In one aspect, the preselected time period extends from the time a previous command for the NVM Set X was received to the time after the new command was received. If the process determines that the new command is not the first command for the NVM Set X after an idle period, the process proceeds to block 506 and ends (e.g., ends and continues regular operations/state). If the process determines that the new command is the first command for the NVM Set X after an idle period, the process proceeds to block 508 where it powers on the backend logic circuitry (BE Logic X) that corresponds to the NVM Set X.

In another aspect, in block 504, the process can determine whether BE Logic X is on or off. If it is on, the process proceeds to block 506 and ends. If it is off, the proceeds to block 508 where it powers on the backend logic circuitry (BE Logic X).

After block 508, the process proceeds to block 510 where it causes the DMA circuitry to perform a restore of operational data/settings for the NVM Set X and/or BE Logic X. In one aspect, the process sends a request to the DMA circuitry to perform the restore function. In one aspect, the DMA circuitry retrieves the operational data from an always on RAM, such as the AON RAM 130 of FIG. 1.

After block 510, the process proceeds to block 512 where it checks to see whether the command fetching is done. As per traditional SSD operation, after the doorbell notification of a new command, the SSD fetches the new command from the host submission queue. This fetching process starts at the doorbell notification and can run in parallel to the instant process 500. If the command fetching is done, then the process proceeds to block 514 to postpone/suspend command flow/execution. If the command fetching is not done, process proceeds to block 516 to determine whether the DMA restoration of operational data for NVM Set X is done. If the DMA is not done, the process returns to block 512 to check on the command fetching. If the DMA is done, the process proceeds to block 518 to determine whether the command flow/execution was postponed/suspended. If the command flow was postponed, the process proceeds to block 520 to resume the command flow/execution. If the command flow was not postponed, the process proceeds to block 522 to end (e.g., end the power on process and enter the power on state for BE Logic X).

In one aspect, the process can perform the sequence of actions in a different order. In another aspect, the process can skip one or more of the actions. In other aspects, one or more of the actions are performed simultaneously. In some aspects, additional actions can be performed. In one aspect, any of the actions of FIG. 5 can be used in conjunction with any of the examples described above.

Figure 6:
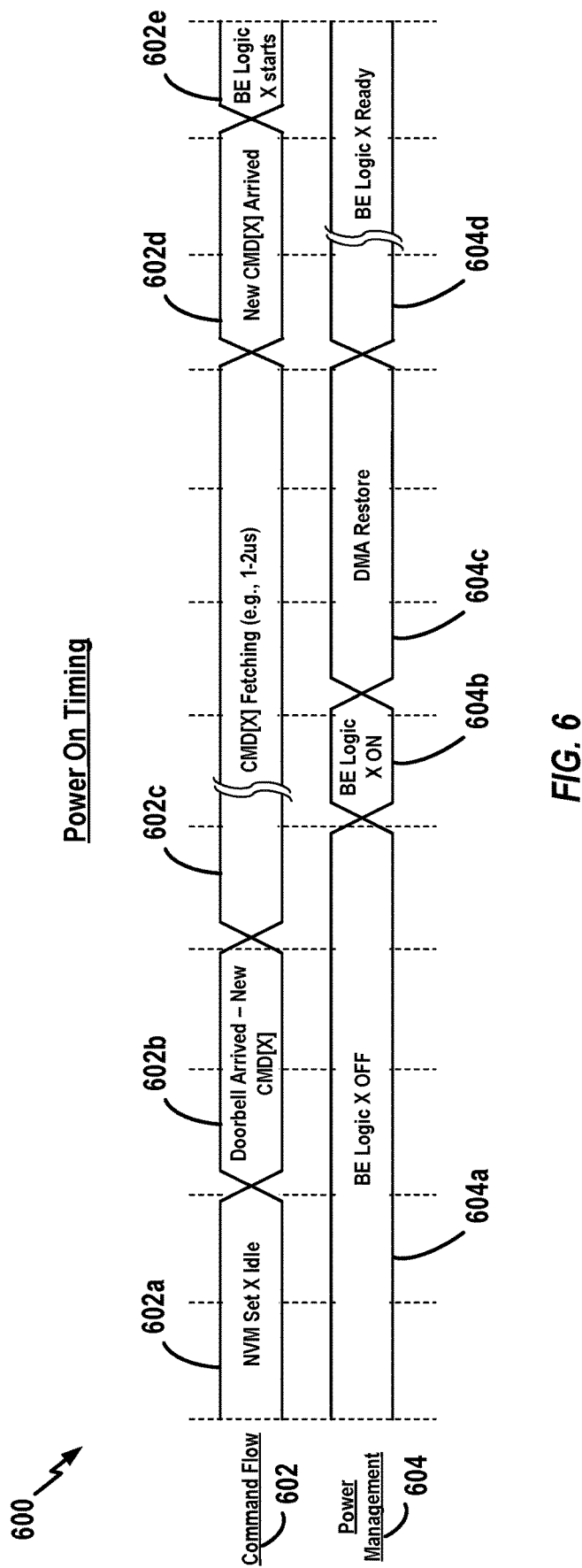
FIG. 6 is a timing diagram illustrating command activities and power management activities to power on a backend logic circuit in accordance with one aspect of the disclosure.

FIG. 6 is a timing diagram 600 illustrating command activities 602 and power management activities 604 to power on a backend logic circuit in accordance with one aspect of the disclosure. In one aspect, timing diagram 600 can provide a visual indicator of the command and power management activities of the power on process of FIG. 5. The command flow can begin with a particular NVM set being idle (NVM Set X Idle) 602*a*, while the power management begins with a backend logic circuitry being off (BE Logic X Off or in a low power state) 604*a*, where the backend logic circuitry (BE Logic X) supports the particular idle NVM set.

In the command flow, and after the NVM Set X Idle state 602*a*, a doorbell indicator arrives 602*b* indicating a new command has been issued by the host for the NVM Set X. In the power management flow, and in response to the new command and prior idle state of NVM Set X, the power management circuitry powers on BE Logic X 604*b*. At the same time, in the command flow, the SSD begins fetching the new command 602*c* from a submission queue at the host. In one aspect, the fetching could take 1-2 microseconds (us). In another aspect, it could take longer or shorter than 1-2 us.

At the same time the SSD (e.g., the front end CPU) is fetching the new command, the power management circuitry is performing a DMA restore to restore operational settings for the BE Logic X and/or operational settings for NVM Set X. Before the command fetching is complete, the BE Logic X is ready 604*d*, after having been powered on and its settings restored. Thus, as can be seen in FIG. 6, the powering on and restoring of the BE Logic X can take place in parallel with the command fetching. In such case, the recovery operation is hidden in the command fetching window such that there is no impact on performance and/or quality of service. When the new command has arrived at the SSD 602*d*, the BE Logic X is ready to assist execution of the command and starts doing so 602*e*.

Figure 7:
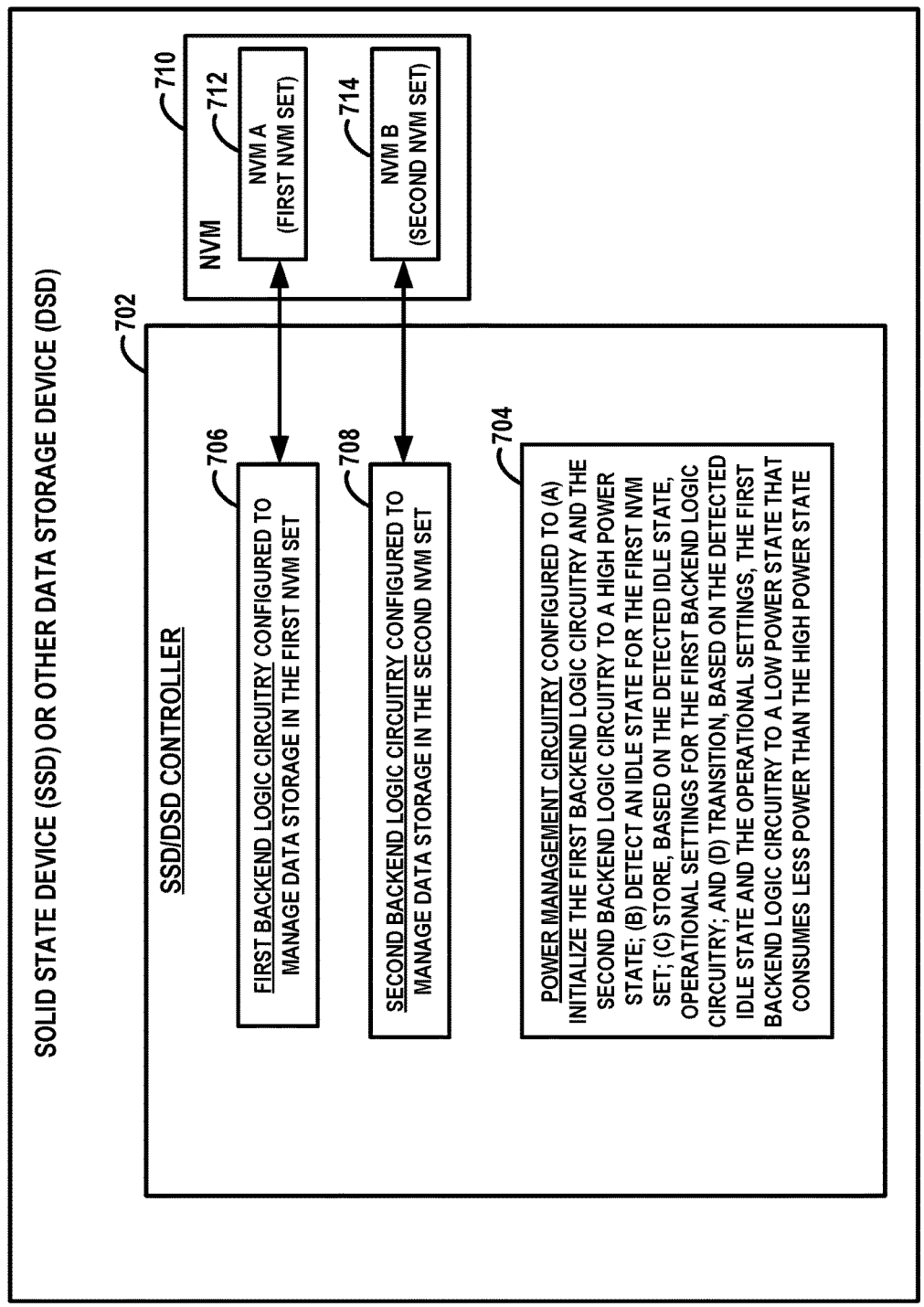
FIG. 7 is a schematic block diagram illustrating an exemplary SSD including a controller with power management circuitry for powering off one of two backend logic circuits each supporting one NVM Set in accordance with one aspect of the disclosure.

FIG. 7 is a schematic block diagram illustrating an exemplary SSD 700 including a controller 702 with power management circuitry 704 for powering off one of two backend logic circuits each supporting one NVM Set in accordance with one aspect of the disclosure. The two backend logic circuits include a first backend logic circuitry 706 and a second backend logic circuitry 708. The SSD further includes an NVM 710 including a first NVM (NVM A) 712 that supports a first NVM set and a second NVM (NVM A) 714 that supports a second NVM set. The first backend logic circuitry 706 is configured to manage data storage in the first NVM set 712. Similarly, the second backend logic circuitry 708 is configured to manage data storage in the second NVM set 714.

In one aspect, the first backend logic circuitry 706 is dedicated to the first NVM set 712 and is isolated from other NVM sets in order to provide a preselected quality of service and/or other performance requirements. Similarly, in one aspect, the second backend logic circuitry 708 is dedicated to the second NVM set 714 and is isolated from other NVM sets in order to provide a preselected quality of service and/or other performance requirements. In FIG. 7, the SSD controller 702 includes two backend logic circuits. In another aspect, the SSD controller 702 can include more than two backend logic circuits, each dedicated to a single NVM set contained within the NVM.

The power management circuitry 704 is configured to (A) initialize the first backend logic circuitry 706 and the second backend logic circuitry 708 to a high power state; (B) detect an idle state for the first NVM set 712; (C) store, based on the detected idle state, operational settings for the first backend logic circuitry 706; and (D) transition, based on the detected idle state and the operational settings, the first backend logic circuitry 706 to a low power state that consumes less power than the high power state.

In one aspect, the SSD 702 and/or power management circuitry 704 can perform any of the processes described herein, including for example, the processes of FIGS. 3-6.

In one aspect, the second backend logic circuitry 708 is further configured to execute a command involving the second NVM set 714 while the first backend logic circuitry 706 is in the low power state. In such case, the SSD 700 is able to process and perform commands for one NVM set while another NVM set is idle and its corresponding backend logic is powered off to conserve power.

In one aspect, and as described above, the first backend logic circuitry 706 may be configured to manage data storage only for the first NVM set 712, and the second backend logic circuitry 708 may be configured to manage data storage only for the second NVM set 714.

In one aspect, the power management circuitry 704 may be further configured to (1) receive an indication of a new command for the first NVM set 712; (2) transition, based on the indication, the first backend logic circuitry 706 to the high power state; and (3) restore the operational settings for the first backend logic circuitry 706. In one aspect, the first backend logic circuitry 706 is further configured to facilitate execution of the new command for the first NVM set 712. In one aspect, the power management circuitry 704 may be further configured to perform the more detailed process of FIG. 5 to power on a disabled/sleeping backend logic circuitry. In one aspect, the transition and restore functions applied to the first backend logic circuitry 706 can be performed at the same time the apparatus (e.g., SSD controller 702) fetches the new command from a host (see e.g., actions 604*b* and 604*c* of FIG. 6 performed at same time as 602*c*.

In one aspect, the SSD controller 702 can also include a frontend logic circuitry configured to receive and execute a command from a host (e.g., see FE CPU 118 and MAC/PHY 120 of FIG. 1). In one aspect, the command may involve the second NVM set 714, and the frontend logic circuitry and the second backend logic circuitry 708 can be configured to work together to execute the command for the second NVM set 714.

In one aspect, the power management circuitry 704 is further configured to detect the idle state for the first NVM set 712 by determining that no commands are pending for the first NVM set 712 (e.g., such as in block 304 of FIG. 3). In one aspect, the power management circuitry 704 is further configured to detect the idle state for the first NVM set 712 by (1) determining that no commands are pending at a host for the first NVM set 712, and (2) determining that no commands are pending internally for the first NVM set 712 (e.g., such as in block 304 of FIG. 3). In another aspect, the power management circuitry 704 is further configured to detect the idle state for the first NVM set 712 by (1) determining that no commands are pending at a host for the first NVM set 712, (2) determining that no commands are pending internally for the first NVM set 712, and (3) waiting for a preselected time period (e.g., such as in blocks 304-314 of FIG. 3).

In one aspect, in the low power state, no power is provided to the first backend logic circuitry 706. In another aspect, in the low power state, some amount of power is provided to the first backend logic circuitry 706 that is lower than the regular high power state, possibly with some limited functionality for the first backend logic circuitry 706 while reducing power consumption.

In one aspect, the power management circuitry 704 is further configured to store, based on the detected idle state, operational settings for the first NVM set 712 as well as the first backend logic circuitry 706.

In one aspect, each of the first NVM set 712 and the second NVM set 714 includes one or more namespaces, and each of the one or more namespaces includes attributes inherited from the respective one of the first and second NVM sets.

In one aspect, even while the first backend logic circuitry 706 is powered off (or transitioned to the low power state), the power to the second backend logic circuitry 708 is maintained in the high power state so commands for the second NVM set 714 may still be executed.

In one aspect, the second backend logic circuitry 708 does not manage data storage for the first NVM set 712, and the first backend logic circuitry 706 does not manage data storage for the second NVM set 714.

In one aspect, the power management circuitry 704 can power off both the first and second back logic circuitry (706, 708) if the corresponding NVM sets become idle, thereby reducing power consumption.

Figure 8:
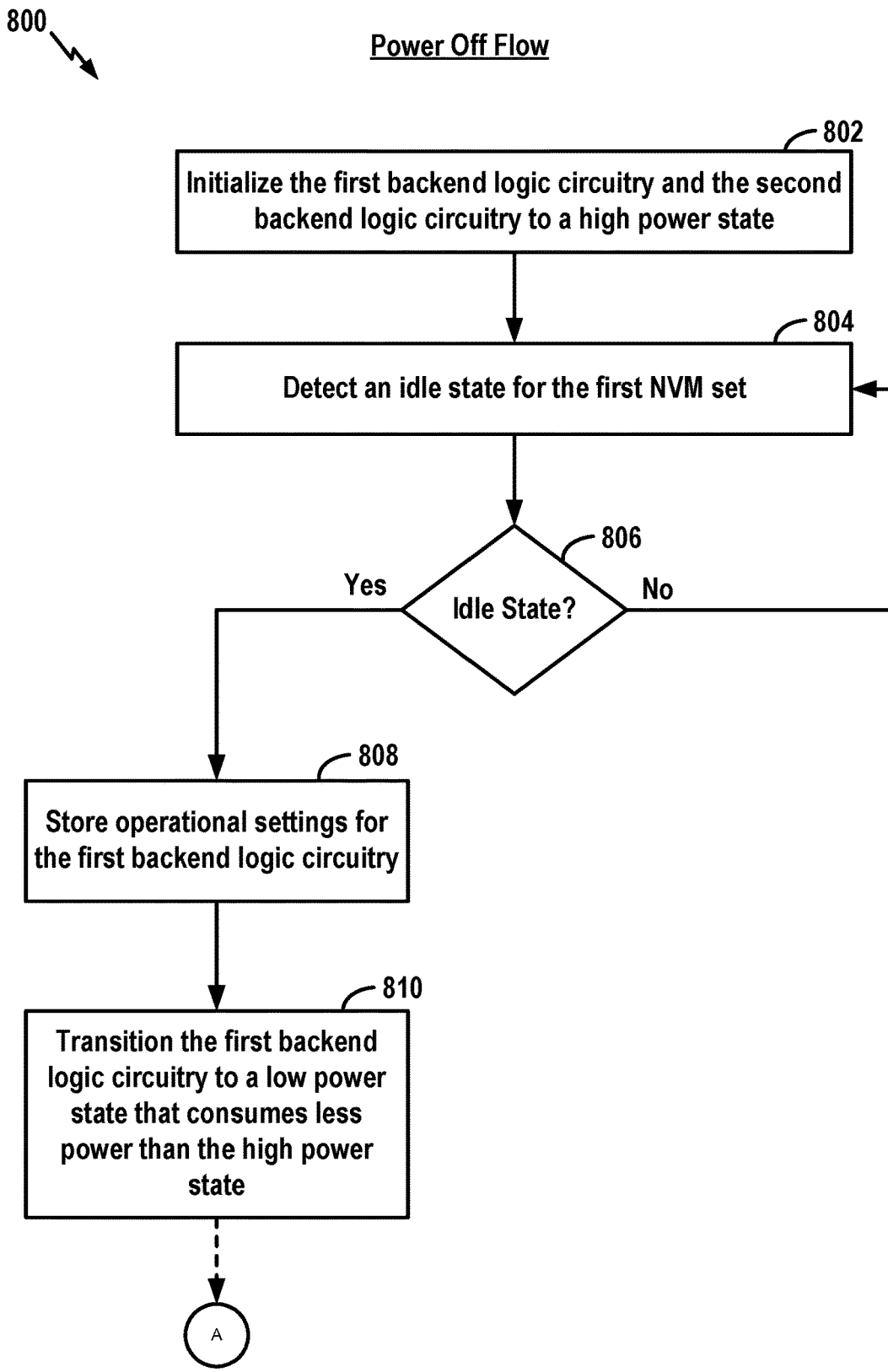
FIG. 8 is a flowchart illustrating an exemplary method that may be performed by the power management circuitry of FIG. 7 to power off a backend logic circuit in accordance with one aspect of the disclosure.

FIG. 8 is a flowchart illustrating an exemplary method 800 that may be performed by the power management circuitry of FIG. 7 to power off a backend logic circuit in accordance with one aspect of the disclosure. In one aspect, the method/process 800 may also be performed by the power management circuitry 116 in the SSD 104 of FIG. 1, or other power management circuitry as described herein.

In block 802, the process first initializes the first backend logic circuitry and the second backend logic circuitry to a high power state. In one aspect, another component of the SSD, other than the power management circuitry, can perform this step to power up the backend logic circuitry. In one aspect, this action may occur as the SSD is powered on.

In block 804, the process detects an idle state for the first NVM set. In one aspect, the process detects the idle state for the first NVM set by determining that no commands are pending for the first NVM set (e.g., such as in block 304 of FIG. 3). In one aspect, the process detects the idle state for the first NVM set by (1) determining that no commands are pending at a host for the first NVM set, and (2) determining that no commands are pending internally for the first NVM set (e.g., such as in block 304 of FIG. 3). In another aspect, the process detects the idle state for the first NVM set by (1) determining that no commands are pending at a host for the first NVM set, (2) determining that no commands are pending internally for the first NVM set, and (3) waiting for a preselected time period (e.g., such as in blocks 304-314 of FIG. 3). In one aspect, the process could check any of the existing NVM sets for an idle state, and modify the rest of the process accordingly (e.g., take action with respect to the corresponding backend logic circuitry for any idle NVM set).

In block 806, the process determines whether there was an idle state (e.g., for the first NVM set). If not, the process returns to block 804 to detect for idle states. If so, the process proceeds to block 808 to store operational settings for the first backend logic circuitry. In one aspect, the process can also store operational settings for the first NVM set. In one aspect, these settings are copied by DMA circuitry (e.g., DMA circuitry 122 of FIG. 1) and stored in an always on RAM.

After block 808, the proceeds to block 810 to transition, based on the detected idle state and the operational settings, the first backend logic circuitry to a low power state that consumes less power than the high power state. In one aspect, the low power state is a state in which no power is supplied to the first backend logic circuitry.

In one aspect, the process can perform the sequence of actions in a different order. In another aspect, the process can skip one or more of the actions. In other aspects, one or more of the actions are performed simultaneously. In some aspects, additional actions can be performed. In one aspect, any of the actions of FIG. 5 can be used in conjunction with any of the examples described above.

Figure 9:
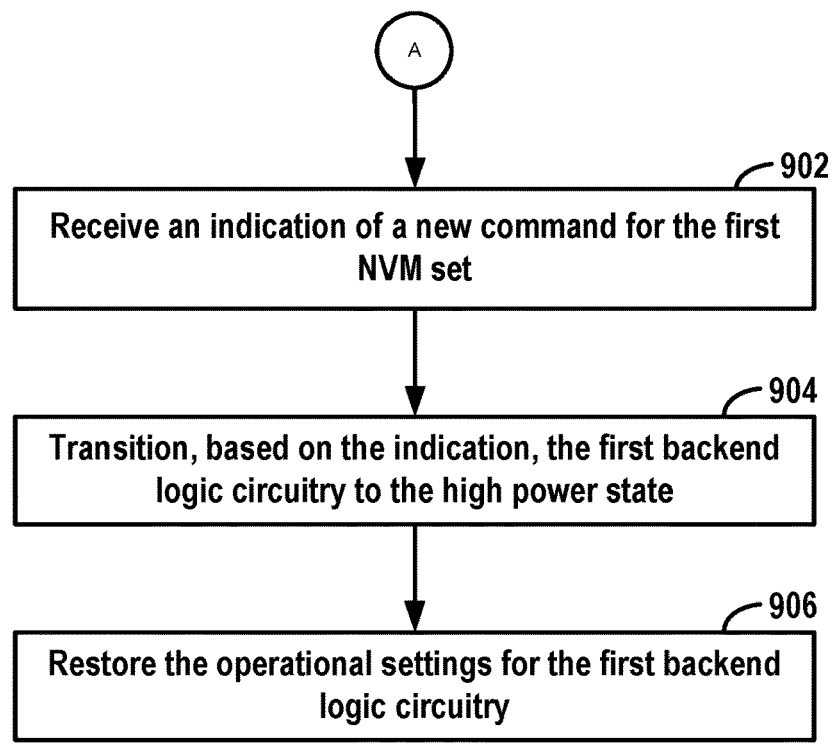
FIG. 9 is a flowchart illustrating an exemplary method that may be performed by the power management circuitry of FIG. 7 to power on a backend logic circuit, after having powered off the backend logic circuit, in accordance with one aspect of the disclosure.

FIG. 9 is a flowchart illustrating an exemplary method 900 that may be performed by the power management circuitry of FIG. 7 to power on a backend logic circuit, after having powered off the backend logic circuit, in accordance with one aspect of the disclosure. In one aspect, this method/process 900 is optional. In one aspect, the method/process 900 may also be performed by the power management circuitry 116 in the SSD 104 of FIG. 1, or other power management circuitry as described herein.

In block 902, the process, after having powered off the backend logic circuit (e.g., the first backend logic circuitry), receives an indication of a new command for the first NVM set. In block 904, the process transitions, based on the indication, the first backend logic circuitry to the high power state. In block 906, the process restores the operational settings for the first backend logic circuitry. In one aspect, the process then executes the new command using the first backend logic circuitry and the first NVM set.

In one aspect, the process can perform the sequence of actions in a different order. In another aspect, the process can skip one or more of the actions. In other aspects, one or more of the actions are performed simultaneously. In some aspects, additional actions can be performed. In one aspect, any of the actions of FIG. 9 can be used in conjunction with any of the examples described above.

Figure 10:
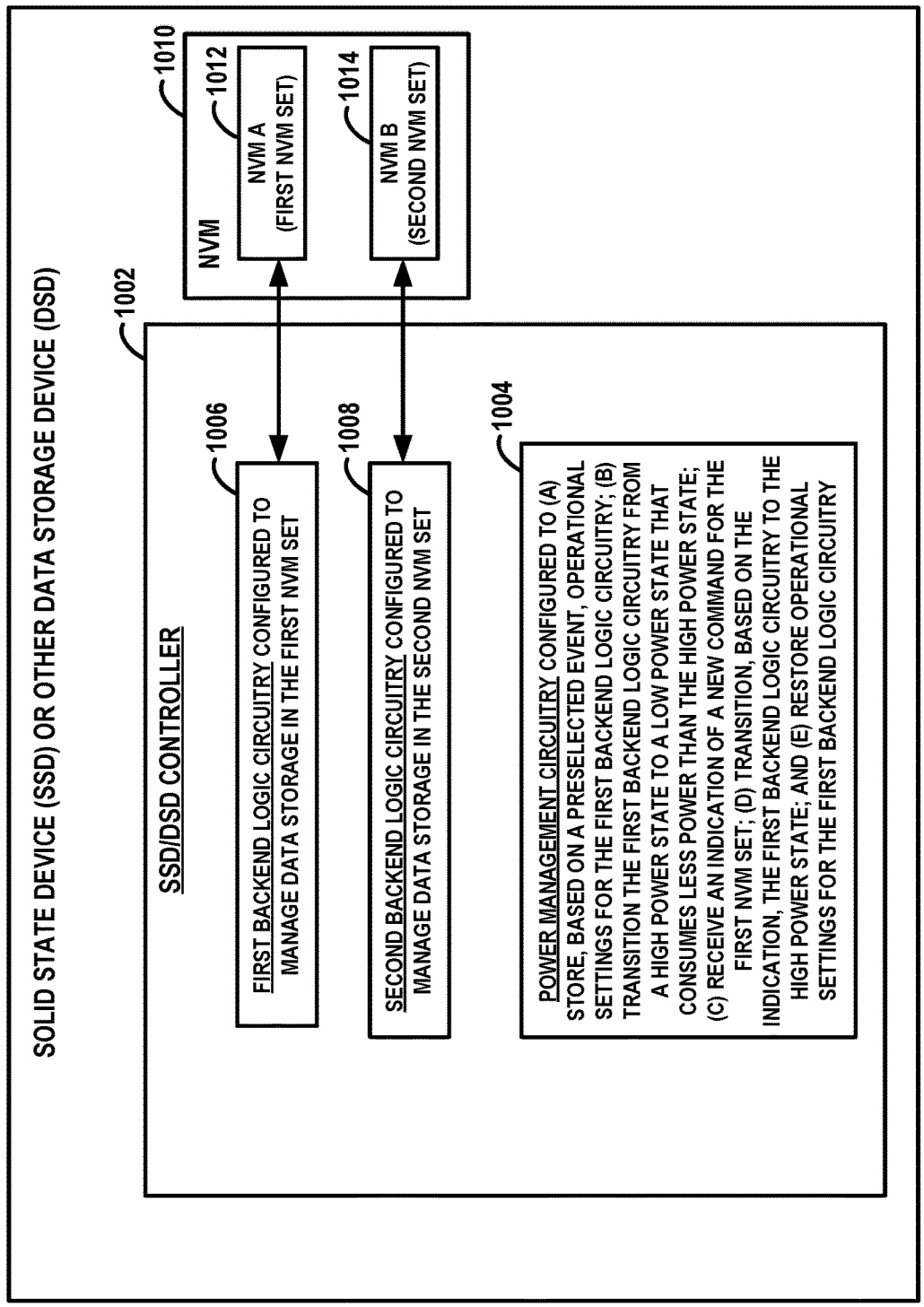
FIG. 10 is a schematic block diagram illustrating an exemplary SSD including a controller with power management circuitry for powering on one of two backend logic circuits each supporting one NVM Set in accordance with one aspect of the disclosure.

FIG. 10 is a schematic block diagram illustrating an exemplary SSD 1000 including a controller 1002 with power management circuitry for powering on one of two backend logic circuits each supporting one NVM Set in accordance with one aspect of the disclosure. The two backend logic circuits include a first backend logic circuitry 1006 and a second backend logic circuitry 1008. The SSD further includes an NVM 1010 including a first NVM (NVM A) 1012 that supports a first NVM set and a second NVM (NVM A) 1014 that supports a second NVM set. The first backend logic circuitry 1006 is configured to manage data storage in the first NVM set 1012. Similarly, the second backend logic circuitry 1008 is configured to manage data storage in the second NVM set 1014.

In one aspect, the first backend logic circuitry 1006 is dedicated to the first NVM set 1012 and is isolated from other NVM sets in order to provide a preselected quality of service and/or other performance requirements. Similarly, in one aspect, the second backend logic circuitry 1008 is dedicated to the second NVM set 1014 and is isolated from other NVM sets in order to provide a preselected quality of service and/or other performance requirements. In FIG. 10, the SSD controller 1002 includes two backend logic circuits. In another aspect, the SSD controller 1002 can include more than two backend logic circuits, each dedicated to a single NVM set contained within the NVM. As such, the SSD may include NVM more than two NVM groups defining two NVM sets.

The power management circuitry 1004 is configured to (A) store, based on a preselected event, operational settings for the first backend logic circuitry 1006; (B) transition the first backend logic circuitry 1006 from a high power state to a low power state that consumes less power than the high power state; (C) receive an indication of a new command for the first NVM set 1012; (D) transition, based on the indication, the first backend logic circuitry 1006 to the high power state; and (E) restore the operational settings for the first backend logic circuitry 1006. In one aspect, the power management circuitry 1004 can transition any one, or both, of the first backend logic circuitry 1006 and the second backend logic circuitry 1008 in to the high power state.

In one aspect, the preselected event is the idle state detected for the first NVM set (e.g., blocks 804-806 in FIG. 8). In one aspect, the SSD 1002 and/or power management circuitry 1004 can perform any of the processes described herein, including for example, the processes of FIGS. 3-6, 9.

Figure 11:
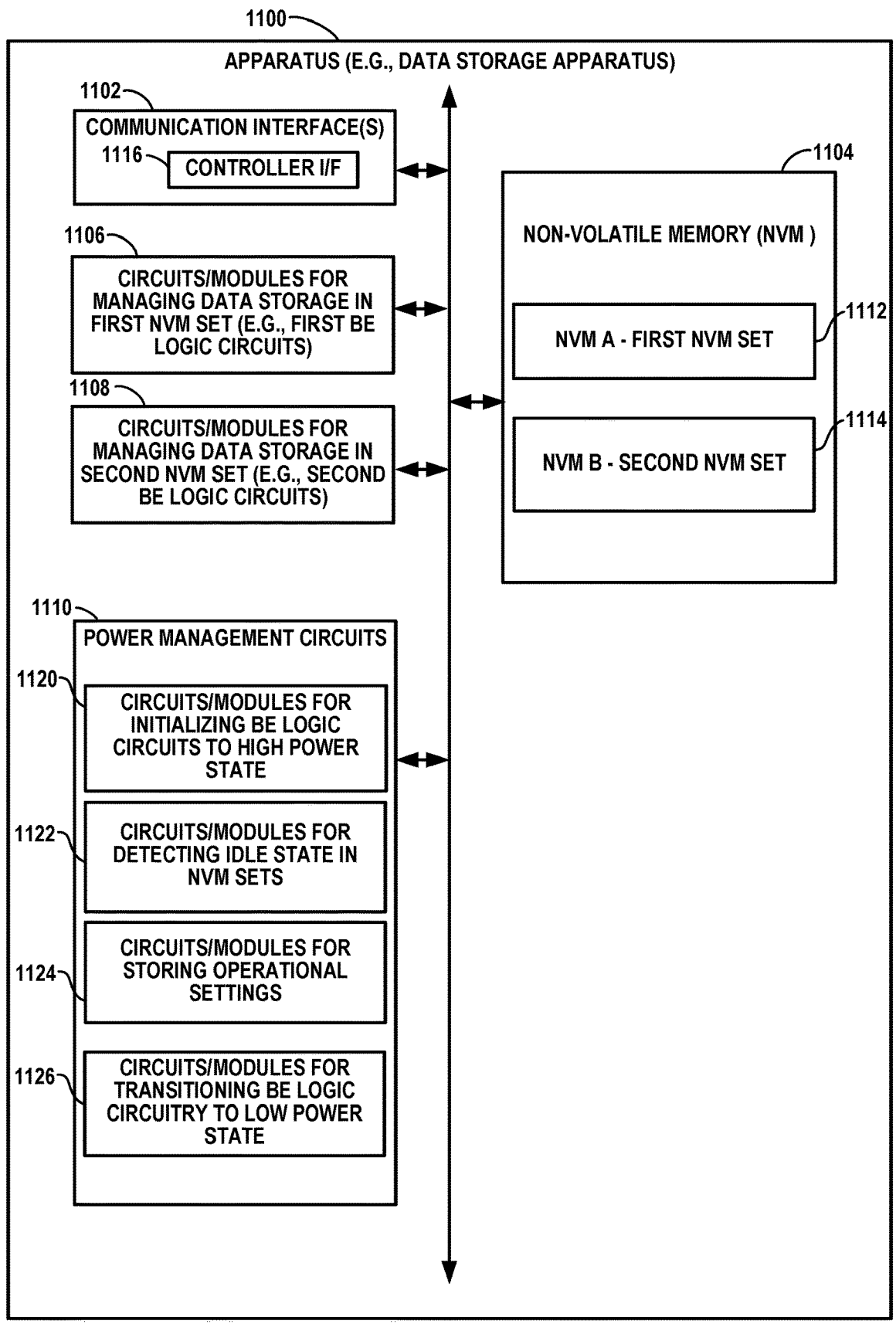
FIG. 11 is a schematic block diagram providing further details of an exemplary data storage apparatus and its components in accordance with one aspect of the disclosure.

FIG. 11 is a schematic block diagram providing further details of an exemplary data storage apparatus 1100 and its components in accordance with one aspect of the disclosure. The apparatus 1100, or components thereof, could embody or be implemented within one or more SSDs. In various implementations, the apparatus 1100, or components thereof, could be a component of a processor, a controller, a computing device, a personal computer, a portable device, or workstation, a server, a personal digital assistant, a digital camera, a digital phone, an entertainment device, a medical device, a self-driving vehicle control device, aerial drone, smart glasses, smart watch or other wearable device, or any other electronic device that stores, processes or uses data.

The apparatus 1100 includes a communication interface 1102, an NVM 1104, circuits (1106, 1108) for managing data storage in NVM sets, and power management circuits 1110. These components can be coupled to and/or placed in electrical communication with one another via suitable components, represented generally by the connection lines in FIG. 11. Although not shown, other circuits such as timing sources, peripherals, voltage regulators, and power management circuits may be provided, which are well known in the art, and therefore, will not be described any further.

The communication interface 1102 provides a means for communicating with other apparatuses over a transmission medium. In some implementations, the communication interface 1102 includes circuitry and/or programming (e.g., a program) adapted to facilitate the communication of information bi-directionally with respect to one or more devices in a system. In some implementations, the communication interface 1102 may be configured for wire-based communication. For example, the communication interface 1102 could be a bus interface, a send/receive interface, or some other type of signal interface including circuitry for outputting and/or obtaining signals (e.g., outputting signals from and/or receiving signals into an SSD). The communication interface 1102 serves as one example of a means for receiving and/or a means for transmitting.

The physical memory array 1104 includes two NVMs, NVM A for a first NVM set 1112 and NVM B for a second NVM set 1114. The physical memory array 1104 may be used for storing data that are manipulated by the circuits 1106, 1108, 1110 or some other component of the apparatus 1100. The physical memory array 1104 may be coupled to the circuits 1106, 1108, and 1110, such that these circuits can read or sense information from, and write or program information to, the physical memory array 1104, including NVM A 1112 and NVM B 1114. That is, the physical memory array 1104 can be coupled to the circuits 1106, 1108, and 1110 so that the physical memory array 1104 is accessible by the circuits 1110.

The circuits 1106 and 1108 are arranged or configured to obtain, process and/or send data, control data access and storage, issue or respond to commands, and control other desired operations. For example, the circuits 1106 and 1108 may be implemented as one or more processors, one or more controllers, and/or other structures configured to perform functions (e.g., the components of the backend logic circuitry of FIG. 2). According to one or more aspects of the disclosure, the circuits 1106 and 1108 may be adapted to perform any or all of the features, processes, functions, operations and/or routines described herein for the backend logic circuitry. For example, the circuits 1106 and 1108 may be configured to perform any of the steps, functions, and/or processes described with reference to the other figures. As used herein, the term "adapted" in relation to the processing circuits 1106 and 1108 may refer to the circuits being one or more of configured, employed, implemented, and/or programmed to perform a particular process, function, operation and/or routine according to various features described herein. The circuits may include a specialized processor, such as an ASIC that serves as a means for (e.g., structure for) carrying out any one of the operations described with reference to the other figures. The circuits serve as an example of a means for processing. In various implementations, the circuits may provide and/or incorporate, at least in part, functionality described above for the management/ support of NVM sets in various embodiments shown. In one aspect, circuit 1106 can act as one means for managing data storage in the first NVM set 1112. In one aspect, circuit 1108 can act as one means for managing data storage in the second NVM set 1114.

The circuits 1110 are arranged or configured to obtain, process and/or send data, control data access and storage, issue or respond to commands, and control other desired operations. For example, the circuits 1110 may be implemented as one or more processors, one or more controllers, and/or other structures configured to perform functions. According to one or more aspects of the disclosure, the circuits 1110 may be adapted to perform any or all of the power management features, processes, functions, operations and/or routines described herein. For example, the circuits 1110 may be configured to perform any of the steps, functions, and/or processes described with reference to the other figures. As used herein, the term "adapted" in relation to the processing circuits 1110 may refer to the circuits being one or more of configured, employed, implemented, and/or programmed to perform a particular process, function, operation and/or routine according to various features described herein. The circuits may include a specialized processor, such as an ASIC that serves as a means for (e.g., structure for) carrying out any one of the operations described with reference to the other figures. The circuits serve as an example of a means for processing. In various implementations, the circuits may provide and/or incorporate, at least in part, functionality described above for the power management of NVM sets in various embodiments shown.

According to at least one example of the apparatus 1100, the processing circuit 1110 may include one or more of: circuit/modules 1120 configured for initializing backend logic circuits to high power states; circuits/modules 1122 configured for detecting idle states in NVM sets; circuits/modules 1124 configured for storing operational settings of various components such as backend logic circuits or NVM sets; and circuits/modules 1126 configured for transitioning backend logic circuits to low power states.

In at least some examples, means may be provided for performing the functions illustrated in FIG. 11 and/or other functions illustrated or described herein. For example, the means may include one or more of: means, such as circuit/modules 1120, for initializing backend logic circuitry to high power states, including for example, means for initializing the means for managing data storage in the first NVM set to a high power state and means for initializing the means for managing data storage in the second NVM set to the high power state; means, such as circuits/modules 1122, for detecting idle states in NVM sets, including for example, means for detecting an idle state for the first NVM set; means, such as circuits/modules 1124, for storing operational settings, including for example, means for storing, based on the detected idle state, operational settings for the means for managing data storage in the first NVM set; and means, such as circuits/modules 1126, for transitioning backend logic circuitry to low power states, including for example, means for transitioning, based on the detected idle state and the operational settings, the means for managing data storage in the first NVM set to a low power state that consumes less power than the high power state.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NVM, including NAND flash memory such as 3D NAND flash memory. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three-dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two-dimensional and three-dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" or "one or more of A, B, or C" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" or "one or more of A, B, or C" is intended to cover A, B, C, A-B, A-C, B-C, and A-B-C, as well as multiples of the same members (e.g., any lists that include AA, BB, or CC). Likewise, "at least one of: A, B, and C" or "one or more of A, B, or C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus comprising:
a non-volatile memory (NVM) comprising a first NVM set and a second NVM set separate from the first NVM set;
a first backend logic circuitry configured to manage data storage in the first NVM set;
a second backend logic circuitry configured to manage data storage in the second NVM set; and
a power management circuitry configured to:
initialize the first backend logic circuitry and the second backend logic circuitry to a high power state;
detect an idle state for the first NVM set;
store, based on the detected idle state, operational settings for the first backend logic circuitry; and
transition, based on the detected idle state and the operational settings, the first backend logic circuitry to a low power state that consumes less power than the high power state while the second backend logic circuitry is in the high power state.

2. The apparatus of claim 1, wherein the second backend logic circuitry is further configured to execute a command involving the second NVM set while the first backend logic circuitry is in the low power state.

3. The apparatus of claim 1:
wherein the first backend logic circuitry is further configured to manage data storage only for the first NVM set; and
wherein the second backend logic circuitry is further configured to manage data storage only for the second NVM set.

4. The apparatus of claim 1, wherein the power management circuitry is further configured to:
receive an indication of a new command for the first NVM set;
transition, based on the indication, the first backend logic circuitry to the high power state; and
restore the operational settings for the first backend logic circuitry.

5. The apparatus of claim 4, wherein the transition and restore functions applied to the first backend logic circuitry are performed at the same time the apparatus fetches the new command from a host.

6. The apparatus of claim 1, further comprising a frontend logic circuitry configured to receive and execute a command from a host.

7. The apparatus of claim 6:
wherein the command involves the second NVM set; and
wherein the frontend logic circuitry and the first backend logic circuitry are configured to execute the command for the second NVM set.

8. The apparatus of claim 1, wherein the power management circuitry is further configured to detect the idle state for the first NVM set by determining that no commands are pending for the first NVM set.

9. The apparatus of claim 1, wherein the power management circuitry is further configured to detect the idle state for the first NVM set by:
determining that no commands are pending at a host for the first NVM set, and
determining that no commands are pending internally for the first NVM set.

10. The apparatus of claim 1, wherein the power management circuitry is further configured to detect the idle state for the first NVM set by:
determining that no commands are pending at a host for the first NVM set;
determining that no commands are pending internally for the first NVM set; and
waiting for a preselected time period.

11. The apparatus of claim 1, wherein in the low power state, no power is provided to the first backend logic circuitry.

12. A method for operating a data storage apparatus comprising a non-volatile memory (NVM) comprising a first NVM set and a second NVM set separate from the first NVM set, the method comprising:
initializing a first backend logic circuitry and a second backend logic circuitry to a high power state, wherein the first backend logic circuitry is configured to manage data storage in the first NVM set and the second backend logic circuitry is configured to manage data storage in the second NVM set;
detecting an idle state for the first NVM set;
storing, based on the detected idle state, operational settings for the first backend logic circuitry; and
transitioning, based on the detected idle state and the operational settings, the first backend logic circuitry to a low power state that consumes less power than the high power state while the second backend logic circuitry is in the high power state.

13. The method of claim 12, further comprising using the second backend logic circuitry to execute a command involving the second NVM set while the first backend logic circuitry is in the low power state.

14. The method of claim 12, further comprising:
receiving an indication of a new command for the first NVM set;
transitioning, based on the indication, the first backend logic circuitry to the high power state; and
restoring the operational settings for the first backend logic circuitry.

15. The method of claim 14, further comprising:
fetching the new command from a host; and
wherein the transitioning and restoring functions applied to the first backend logic circuitry are performed at the same time as the fetching.

16. The method of claim 12, further comprising:
receiving, a frontend logic circuitry, a command from a host, wherein the command involves the second NVM set; and
executing, using the frontend logic circuitry and the first backend logic circuitry, the command for the second NVM set.

17. The method of claim 12, wherein the detecting the idle state for the first NVM set comprises determining that no commands are pending for the first NVM set.

18. The method of claim 12, wherein the detecting the idle state for the first NVM set comprises:

determining that no commands are pending at a host for the first NVM set, and determining that no commands are pending internally for the first NVM set.

19. The method of claim 12, further comprising providing, in the low power state, no power to the first backend logic circuitry.

20. A data storage apparatus comprising:

a non-volatile memory (NVM) comprising a first NVM set and a second NVM set separate from the first NVM set;

means for managing data storage in the first NVM set;

means for managing data storage in the second NVM set;

means for initializing the means for managing data storage in the first NVM set to a high power state;

means for initializing the means for managing data storage in the second NVM set to the high power state;

means for detecting an idle state for the first NVM set;

means for storing, based on the detected idle state, operational settings for the means for managing data storage in the first NVM set; and means for transitioning, based on the detected idle state and the operational settings, the means for managing data storage in the first NVM set to a low power state that consumes less power than the high power state, while the means for managing data storage in the second NVM set is in the high power state.

* * * * *